(12) United States Patent
Dvorkin et al.

(10) Patent No.: US 9,692,089 B2
(45) Date of Patent: Jun. 27, 2017

(54) SINGLE WIRE BATTERY PACK TEMPERATURE AND IDENTIFICATION METHOD

(71) Applicant: DURACELL U.S. OPERATIONS, INC., Wilmington, DE (US)

(72) Inventors: Elik Dvorkin, New Haven, CT (US); Tanmay P. Gajjar, Holmes, NY (US)

(73) Assignee: DURACELL U.S. OPERATIONS, INC., Wilmington, DE (US)

(*) Notice: Subject to any disclaimer, the term of this patent is extended or adjusted under 35 U.S.C. 154(b) by 331 days.

(21) Appl. No.: 14/444,044

(22) Filed: Jul. 28, 2014

(65) Prior Publication Data

US 2016/0028130 A1    Jan. 28, 2016

Related U.S. Application Data

(63) Continuation of application No. 12/981,737, filed on Dec. 30, 2010, now Pat. No. 8,823,321.

(51) Int. Cl.
| | |
|---|---|
| H02J 7/04 | (2006.01) |
| H01M 10/48 | (2006.01) |
| H02J 7/00 | (2006.01) |
| G01R 31/36 | (2006.01) |
| H01M 10/44 | (2006.01) |

(52) U.S. Cl.
CPC ........ *H01M 10/486* (2013.01); *G01R 31/362* (2013.01); *G01R 31/3624* (2013.01); *G01R 31/3665* (2013.01); *H01M 10/441* (2013.01); *H01M 10/482* (2013.01); *H02J 7/007* (2013.01); *H02J 7/0045* (2013.01)

(58) Field of Classification Search
USPC .................................................. 320/150
See application file for complete search history.

(56) References Cited

U.S. PATENT DOCUMENTS

| | | | | |
|---|---|---|---|---|
| 5,184,059 | A | * 2/1993 | Patino | H01M 10/44 320/125 |
| 5,656,917 | A | 8/1997 | Theobald | |
| 5,965,997 | A | * 10/1999 | Alwardi | G01R 31/3606 320/132 |
| 6,404,164 | B1 | 6/2002 | Bean et al. | |
| 2008/0238357 | A1 | * 10/2008 | Bourilkov | H02J 7/0006 320/106 |
| 2009/0167246 | A1 | * 7/2009 | Shen | H01M 10/486 320/128 |

FOREIGN PATENT DOCUMENTS

| | | |
|---|---|---|
| EP | 0 611 106 A1 | 8/1994 |
| WO | WO 03/067735 A1 | 8/2003 |

OTHER PUBLICATIONS

Search report PCT / USS2011/067337.

* cited by examiner

*Primary Examiner* — Robert Grant
(74) *Attorney, Agent, or Firm* — Marshall, Gerstein & Borun LLP

(57) ABSTRACT

Disclosed are techniques for identifying battery pack types and by inference battery chemistries by measuring a transient response of the battery pack to signal applied to the battery pack.

28 Claims, 11 Drawing Sheets

SINGLE WIRE BATTERY PACK TEMPERATURE AND IDENTIFICATION METHOD

BACKGROUND

Conventional chargers rely on an electrical, mechanical or digital signal technique to determine the type of battery being charged and thus the appropriate charge regime to apply. For example, some techniques are based on the use of an internal battery ID resistor, the value of which determines the charging parameters applied for that specific battery. Mechanical techniques have also been used, such as using the location of a connector polarity key or the location of a particular connector pin to distinguish between different battery models requiring different charging parameters. The Smart Battery SMBus standards, for example, use a serial data communications interface to communicate the charging parameters to the charging device. The above approaches require added connection points beyond the battery power terminals or some added mechanical feature not required for the basic battery function of delivering stored energy to a portable device. In the case of the Smart Battery standards, for example the SMBus standard, an electrical circuit and at least two additional connector pins are required to implement the smart interface between the charger and battery, adding to the cost, complexity and size of the battery.

SUMMARY

Thus, for cost sensitive applications such conventional techniques have concomitant disadvantages.

In one aspect, a method for identifying a type of battery pack includes applying a signal to a sense terminal of the battery pack, measuring a transient response of the battery pack to the applied signal and determining from the measured transient response the battery pack type.

Embodiments may include one or more of the following.

The method includes determining a charging current to be applied to the battery based on the measured transient response and applying the determined charging current to the battery. The method includes applying the signal by causing a first terminal of a controller unit of a battery charger to a low state and measuring the transient response of the battery to the signal at a second, different terminal of the controller unit of the battery charger. Measuring the transient response includes measuring a voltage between a terminal of the battery pack and an input to a controller in response to applying the signal at a first time instance and measuring the voltage between the terminal of the battery pack, and the input of the controller in response to applying the signal at a subsequent time instance. Measuring the transient response includes computing a value of the transient response over the first and subsequent instances of time. Determining the battery pack type includes accessing a lookup table storing transient response values, associated with plural, different battery packs to provide an indication of battery pack type. The battery is lithium-iron-phosphate electrochemical cell.

The method further includes accessing a lookup table storing multiple charging current values, associated with a corresponding identified battery type, periodically measuring the voltage between terminals of the battery, and adjusting the charging current applied to the battery when the measured voltage between the terminals of the battery reaches a pre-determined voltage value such that the voltage between the terminals of the battery is maintained at the pre-determined voltage value. The battery pack comprises a resistor and the transient response of the battery pack is measured taking into consideration the value of resistance of the resistor. The resistor is a thermistor and the transient response of the battery pack is measured taking into consideration the value of resistance of the thermistor. The method further includes measuring the value of resistance of the thermistor to infer a value of temperature of the battery in the battery pack.

According to an additional aspect of the present invention, a charging device is configured to charge a rechargeable battery housed in a battery pack. The battery pack includes at least one rechargeable electrochemical cell, the charging device comprising a charging compartment configured to receive the battery, the charging compartment having electrical contacts configured to be coupled to respective terminals of the battery; and a controller configured to apply a signal to a terminal of the battery pack, measure a transient response of the battery pack to the applied signal and determining the battery pack from the measured transient response.

Embodiments may include one or more of the following.

The controller is further configured to cause the determined charging current to be applied to the battery. The device further includes a capacitor coupled to a first input of the controller and a resistor coupled to an output terminal of the controller, the output terminal supplying the signal to the battery pack. The controller is configured to determine the transient response of the battery pack to the signal by:

$$\tau_{BP1} = R_{th} \| R_{pd} \| R_{pu} \times (C_{\_a/d})$$

where $R_{th}$ is a resistor in the battery pack $R_{pd}$ and $R_{pu}$ are resistors coupled to the output terminal and a voltage supply of the controller, respectively, and $C_{\_a/d}$ is the capacitor coupled to the first input of the controller.

The controller is configured to determine the transient response of the battery pack to the signal by:

$$\tau_{BP2} = R_{th} \| R_{pd} \| R_{pu} \times (C_{\_a/d} + C_{\_bp2})$$

where $R_{th}$ is a resistor in the battery pack $R_{pd}$ and $R_{pu}$ are resistors coupled to the output terminal and a voltage supply of the controller, respectively, $C_{\_a/d}$ is a capacitor coupled to the first input of the controller and $C_{\_bp2}$ is a capacitor coupled to a terminal of the battery pack in parallel with the resistor $R_{th}$.

The rechargeable battery includes a lithium-iron-phosphate rechargeable cell.

A battery pack for housing a rechargeable battery, includes a housing, a resistor disposed in the housing of the battery pack, the resistor having one end coupled to a reference terminal and second end coupled to a sense terminal of the battery pack, and a capacitor coupled to the terminal of the battery pack and the reference terminal in parallel with the resistor.

Embodiments may include one or more of the following.

The battery pack includes a positive output terminal that is configured to couple to an anode of a rechargeable battery. The battery pack includes a rechargeable cell disposed in the battery pack having an anode terminal coupled to the positive output terminal of the battery pack and a cathode coupled to the reference terminal of the battery pack. The battery output terminal of the battery pack and the sense terminal of the battery pack are different terminals, with the battery output terminal electrically isolated from the sense terminal.

One or more of the above aspects may include one or more of the following advantages.

The above arrangements may accurately determine the type of battery chemistry present, and thus deliver the appropriate charging regime for the battery that is present. These arrangements also permit the chargers to be used for charging different types of batteries or battery packs, while also being able to accurately monitor the temperature of the batteries or battery pack. Other advantages include elimination of expensive microprocessors, microcontrollers, or controllers in the battery pack, and elimination of an extra pin since battery temperature and battery/battery pack type can be ascertained from signals on a common pin. With the above arrangements, the accuracy in the measurement of a thermistor resistance value is unaffected when identifying battery types.

Other features and advantages of the invention will be apparent from the description and from the claims.

DETAILED DESCRIPTION

System Description

Described is a technique for inexpensively differentiating between battery chemistries/battery pack types on a universal charger system, as well as monitoring temperature of the battery pack over a single shared electrical connection. Such a charger is configured to determine, apply and control charging current for charging a rechargeable battery without the need for prior knowledge of the battery type and/or capacity. The charger is not limited to, but is particularly useful for charging battery cells of various sizes, including battery cells used in many modern portable consumer electronic products, such as cellular telephones, MP3 players and digital cameras. The disclosed charger may be applied to many different rechargeable battery types, including lithium ion batteries having high rate charge capability, such as those using lithium iron-phosphate or similar phosphate based intercalation compounds as one of the battery electrodes, as well as lithium-ion batteries, and also lead-acid, nickel metal hydride, nickel cadmium, nickel zinc, and silver zinc batteries. The disclosed charger may further be configured to charge different types of batteries, including, for example, cylindrical batteries, prismatic batteries, button-cell batteries, and so forth.

Figure 1:
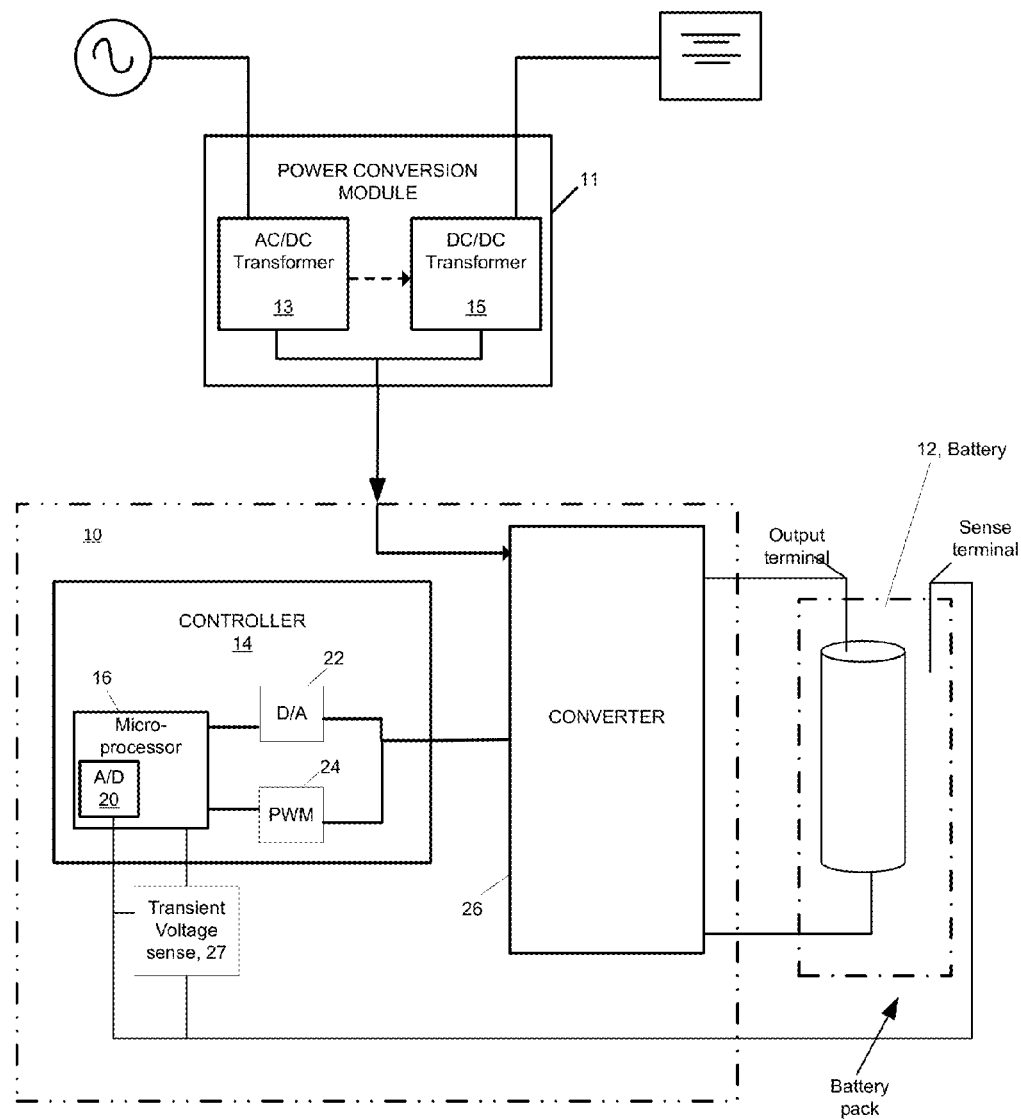
FIG. 1 is a block diagram of an exemplary charger system.

Referring to FIG. 1, an adaptive charger 10 configured to charge batteries in a battery pack and to determine a transient response of the battery pack in order to identify the battery pack type is shown. The battery pack includes one or more batteries 12 having one or more electrochemical cells that is received in a receptacle or compartment (not shown) of the charger 10. The battery 12 is a secondary cell. While primary electrochemical cells are meant to be discharged, e.g., to exhaustion, only once, and then discarded secondary cells are intended to be recharged. Primary cells are described, for example, in David Linden, Handbook of Batteries (McGraw-Hill, 2d ed. 1995). Secondary electrochemical cells can be recharged for many times, e.g., more than fifty times, a hundred times, or more times. Secondary cells are described, e.g., in Falk & Salkind, "Alkaline Storage Batteries", John Wiley & Sons, Inc. 1969; U.S. Pat. No. 345,124; and French Patent No. 164,681, all hereby incorporated by reference. In the embodiments described herein, the battery 12 is a secondary, or rechargeable, battery.

The charger 10 is coupled to a power conversion module 11. The power conversion module 11 includes an AC-DC power converter 13 that electrically couples to an external AC power source, such as a source providing power at a rating of 96V-220V and 50 Hz-60 Hz, and converts the externally supplied AC power to a DC power level suitable for charging rechargeable batteries (e.g., DC power levels of approximately between 3.8-4.2 V). The AC-DC power converter 13 may be implemented as an AC-DC switcher configured to accept input power at a first voltage and transform it to a lower voltage.

In some embodiments, a DC-DC power converter 15 is incorporated into the power conversion module 11 that is adapted to convert an external DC power source, such as a car's DC power supply, to a DC power level suitable for charging rechargeable batteries may be used. Other power conversion configurations may also be used.

The charger 10 determines a charging current to be applied to the rechargeable battery 12 based on a measured transient response of the battery pack 12 incorporating the batteries. The value of the measured transient response is indicative of the battery pack type that is being charged by the charger 10, and thus enables a controller 14 to determine the charging current level to apply to the battery 12. Various techniques could be used for determining the charging current regime to apply such as by using a look up table that is indexed by values determined for the transient response of the battery, as discussed below to determine the charge regime.

Figure 3:
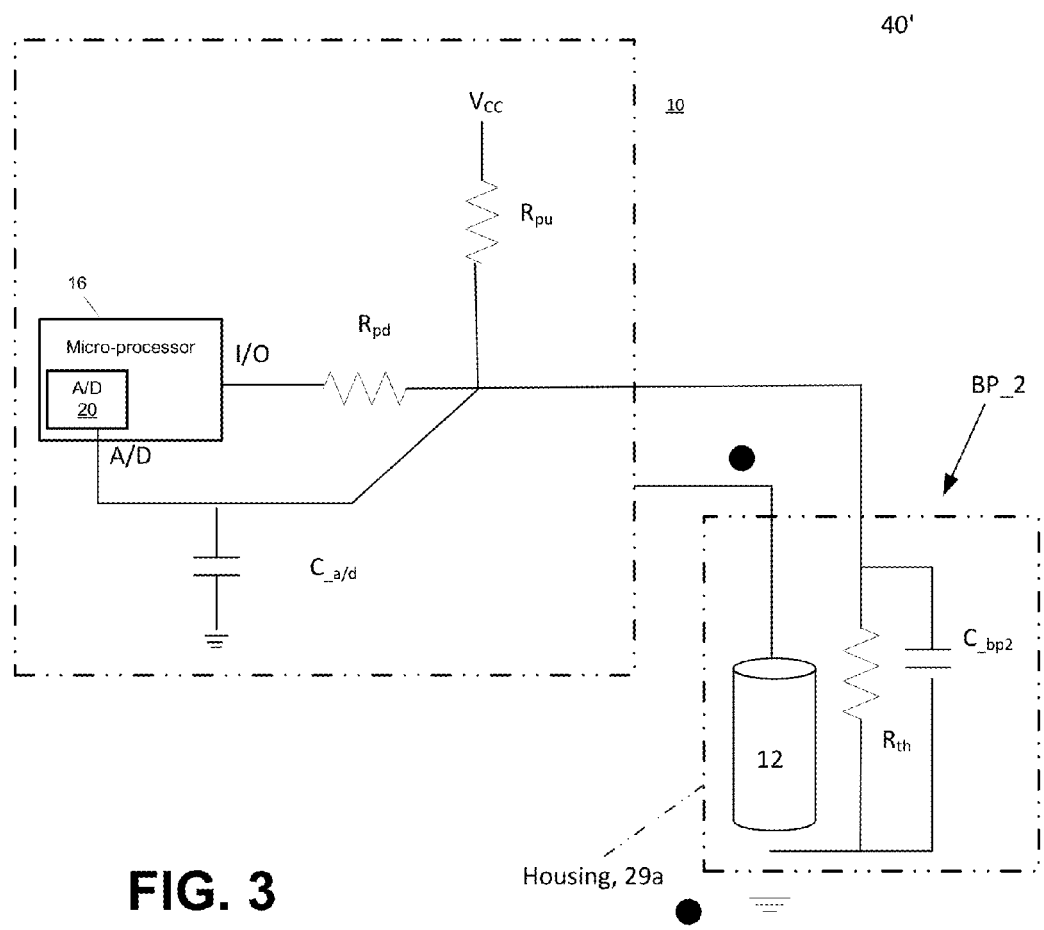

The measured transient response is used as identification mechanism to identify the particular battery pack type (and from which can be inferred battery chemistry of the battery 12 in the battery pack). The measured transient response is of a resistor typically, a thermistor coupled to the battery pack and an added capacitance (FIG. 3). In such embodiments, the charger 10 identifies the battery pack by measuring the transient response of the resistance of the thermistor and capacitance of the battery pack, as will be discussed below.

Figure 2:
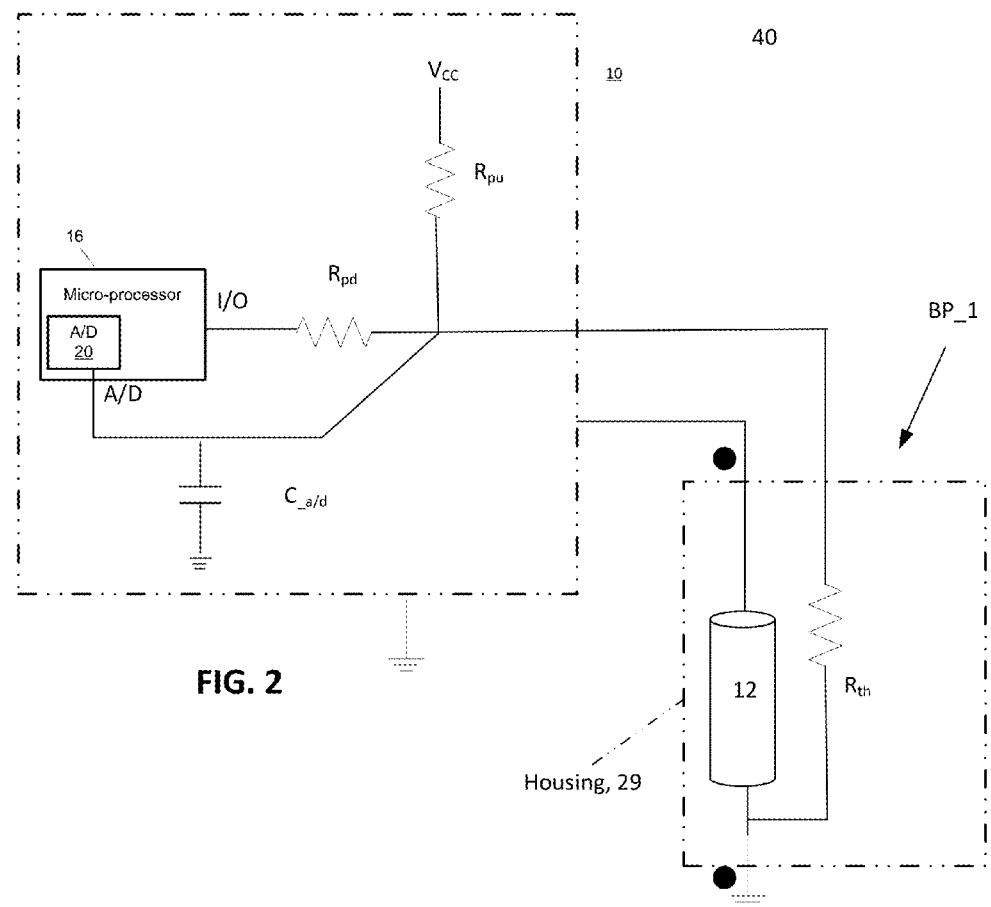
FIGS. 2 and 3 are diagrams depicting circuits for identifying battery or battery pack type for use in a charger such as that shown in FIG. 1.

The controller 14 is configured to control the operation of the charger 10, including measuring the transient response that is used to identify the type of battery pack connected to the charger 10, and to determine the charging current and/or charging profile (e.g., duration of charging period, adjustment of charging current and/or voltage at certain time instances, etc.) to apply to the battery 12. Various resistance values of thermistors (or resistors) are used in combination with a standardized measurement scheme to identify different battery pack types (FIG. 2). In an alternative, various resistance values of thermistors (or resistors) in combination capacitance values of added capacitors in the battery pack are used in combination with a standardized measurement scheme to identify the different battery pack types (FIG. 3).

The controller 14 includes a processor device 16 configured to control the charging operations performed on the battery 12 and control operations, as will be described below. The processor device (MCU) 16 may be any type of computing and/or processing device, such as a PIC18F1320 microcontroller from Microchip Technology Inc. The processor device 16 used to implement the charger 10 can include volatile and/or non-volatile memory elements configured to store software containing computer instructions to enable general operations of the processor-based device, as well as implementation programs to perform charging operations on the battery 12 connected to the charger, based on the at least one measured electric characteristic of the rechargeable battery 12.

In this example, the processor 16 includes an analog-to-digital converter (ADC) 20 that receives signals from transient voltage sense circuits 27 (described below) indicative of the battery pack. From the indication of battery pack type a suitable charging regime is selected.

The controller 14 further includes a digital-to-analog converter device (DAC), 22, and/or a pulse-width modulator (PWM), 24, that receives digital signals generated by the processor device 16, and generates in response electrical signals that regulate switching circuitry, such as a DC/DC converter 26, e.g., a buck type converter.

Referring now to FIG. 2, a first exemplary charger system 40 includes the MCU 16 and voltage sense circuit 27 comprised of resistors $R_{pd}$ and $R_{pu}$, capacitor $C_{a/d}$ and a Battery Pack 1. The charger system 40 is configured to supply charging current to the Battery Pack 1. The MCU determines the transient response to a signal from resistors $R_{pd}$ and $R_{pu}$, capacitor $C_{a/d}$ and the thermistor in Battery Pack 1, as discussed below. The thermistor in Battery Pack 1 is a temperature sensing circuit element, $R_{th}$, as otherwise commonly available in battery packs to measure temperature of the battery pack. Battery 12 (FIG. 1) is shown in the battery pack BP_1 with the battery pack having a housing 29.

Identifying the battery pack (and inferring battery chemistry and/or battery configuration) is based on the host Micro Controller Unit (MCU) measuring transient voltage response to a signal passed through the passive circuit components ($R_{pd}$ and $R_{pu}$, capacitor $C_{a/d}$ and the thermistor $R_{th}$). The A/D (Analog to Digital Converter) has an input to which the resistors $R_{pd}$ and $R_{pu}$, and capacitor $C_{a/d}$ have one end coupled. The MCU through the A/D input monitors battery pack temperature and identifies the battery pack type. The MCU also includes an I/O pin (input/output). By driving the I/O (input/output) pin high or low, respectively, over this single shared electrical connection, a transient response is generated from the battery pack and the MCU can measure this transient response at the A/D connector pin.

Referring now to FIG. 3, another exemplary system 40' includes Battery Pack 2. The system includes the sense circuit 27 comprised of resistors $R_{pd}$ and $R_{pu}$, capacitor $C_{a/d}$ and host MCU (microcontroller unit). The charger system 40' is configured to supply charging current to the Battery Pack 2. The resistors $R_{pd}$ and $R_{pu}$, in combination with capacitor $C_{a/d}$ are used to sense the transient voltage characteristics of Battery Pack 2, as discussed below. The Battery Pack 2 includes a thermistor, (temperature sensing circuit element), $R_{th}$, as in other commonly available battery packs. In this system to further differentiate between different battery packs Battery Pack 2 includes an added capacitor $C_{bp2}$ coupled in shunt across the temperature sensing circuit element, thermistor $R_{th}$. The battery 12 (FIG. 1) is shown in the battery pack BP_2 the battery pack having a housing 29a.

Identifying the battery pack (and inferring battery chemistry and/or battery configuration) is based on the host Micro Controller Unit (MCU) measuring transient voltage response of a signal through the passive circuit components (resistors $R_{pd}$ and $R_{pu}$, capacitor $C_{a/d}$ thermistor $R_{th}$ and added capacitor $C_{bp2}$).

As with the system 40 of FIG. 2, the Host charger MCU includes an A/D (Analog to Digital Converter) to which the resistors $R_{pd}$ and $R_{pu}$, capacitor $C_{a/d}$ have one end coupled to. The MCU through the A/D input pin monitor battery pack temperature and identify the battery pack type. The MCU also includes an I/O pin (input/output). By driving the I/O (input/output) pin high or low, respectively, over this single shared electrical connection the MCU can measure the transient response of the signal at the A/D connector.

Figure 8:
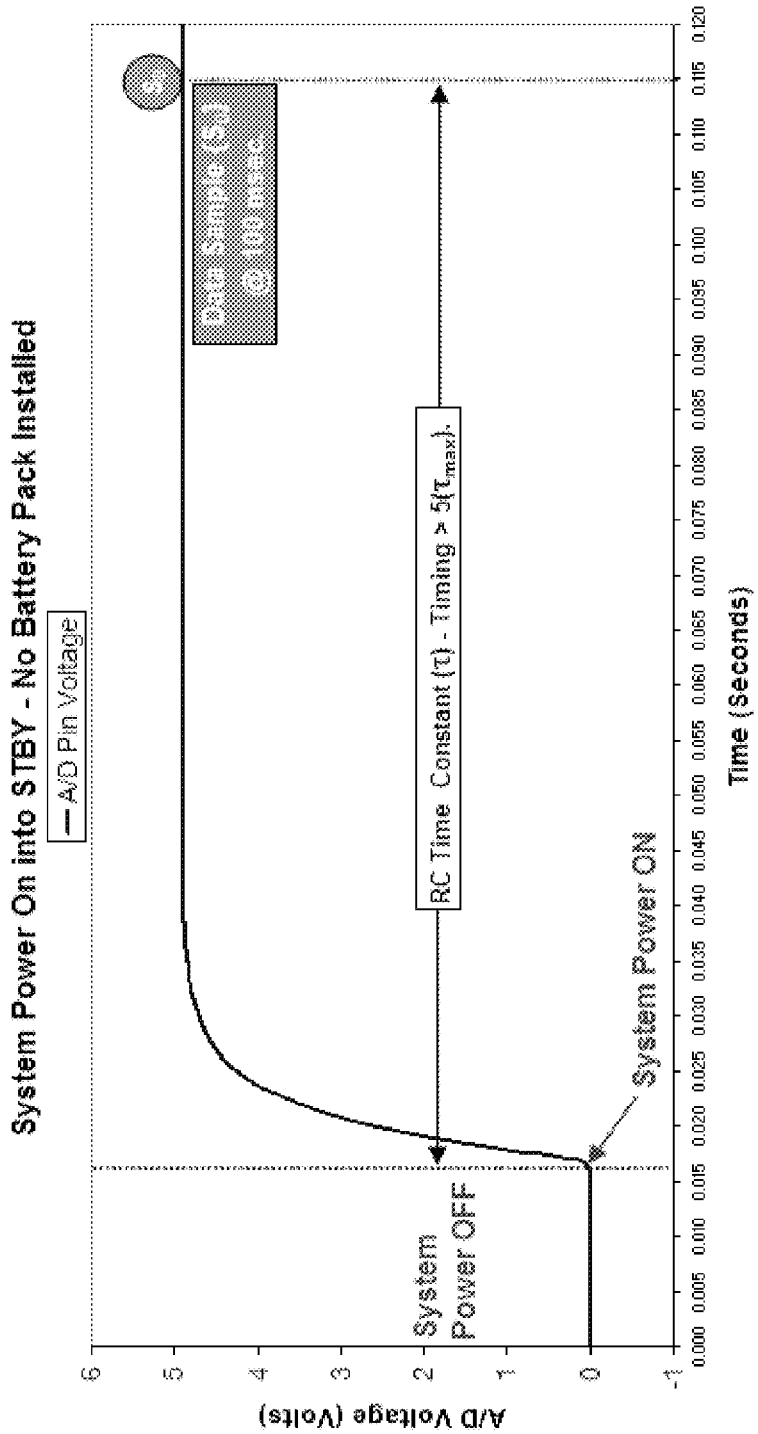
FIGS. 8-11 are plots of voltage vs. time.

The configurations of FIGS. 2 and 3, above provide RC (Resistive-Capacitive) circuit equivalents, and RC time constants, (τBP1) and (τBP2) for Battery Pack 1 and Battery Pack 2, respectively. Also, if there is no battery pack installed, there is a time constant, τSYS for system start up time, and when {S0} is sampled, the system will remain in standby STBY, as seen in Plot 1 (FIG. 8).

Figure 4:
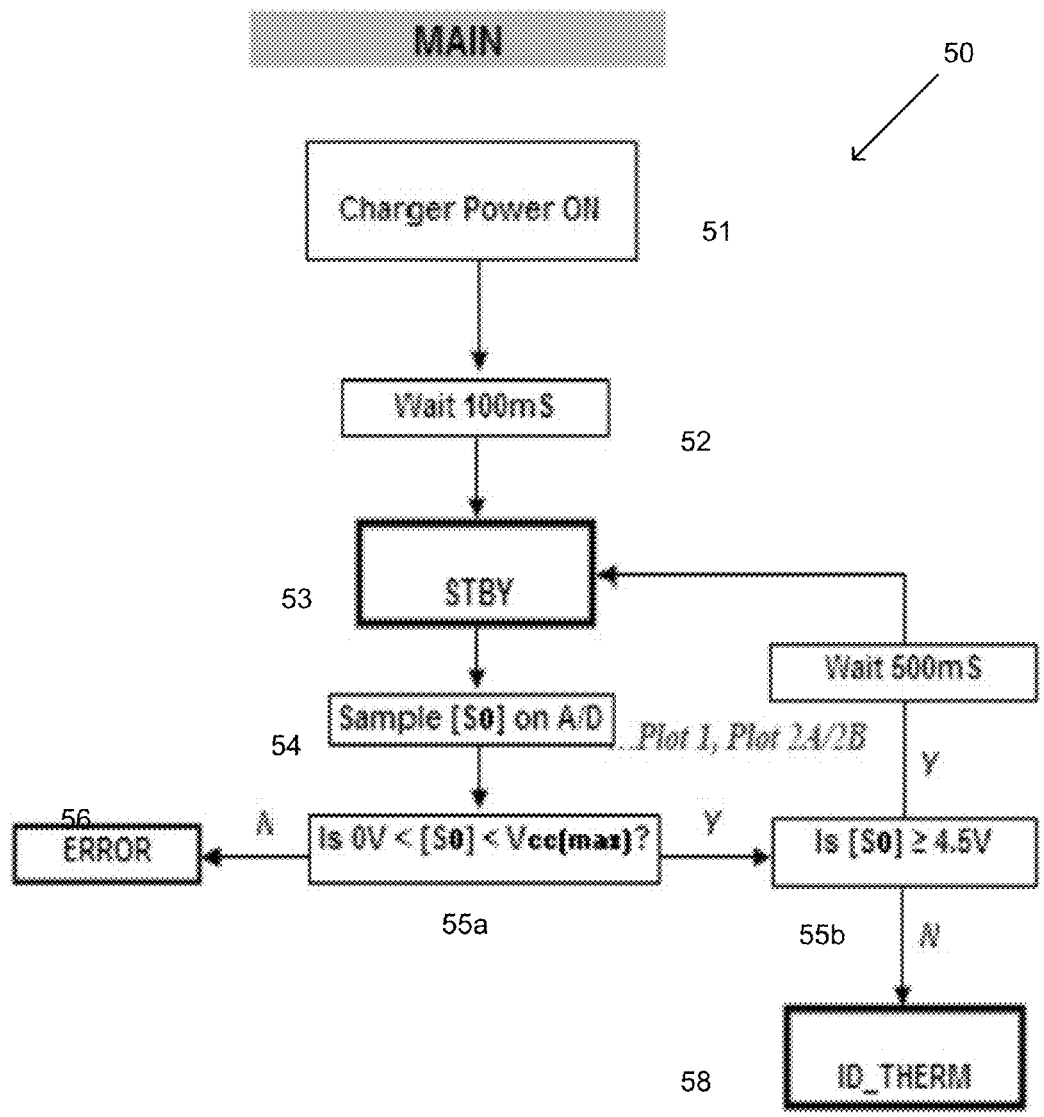
FIGS. 4-7 are flow diagrams of exemplary charger routines.

Referring to FIG. 4, a main sequence 50 of the MCU is illustrated. Upon charger power on, 51, the charger waits 52 for a predetermined period of time, e.g., 100 ms and goes into a standby 53 mode. After a battery pack installation is detected the battery voltage is sampled 54 $S_0$ at the A/D converter input (See plot of FIG. 8). Depending on the value of $S_0$, 55a, 55b, the sequence either issues an error 56, goes back to standby 54, via a wait 57 or invokes the ID_THERM routine 60.

Figure 5:
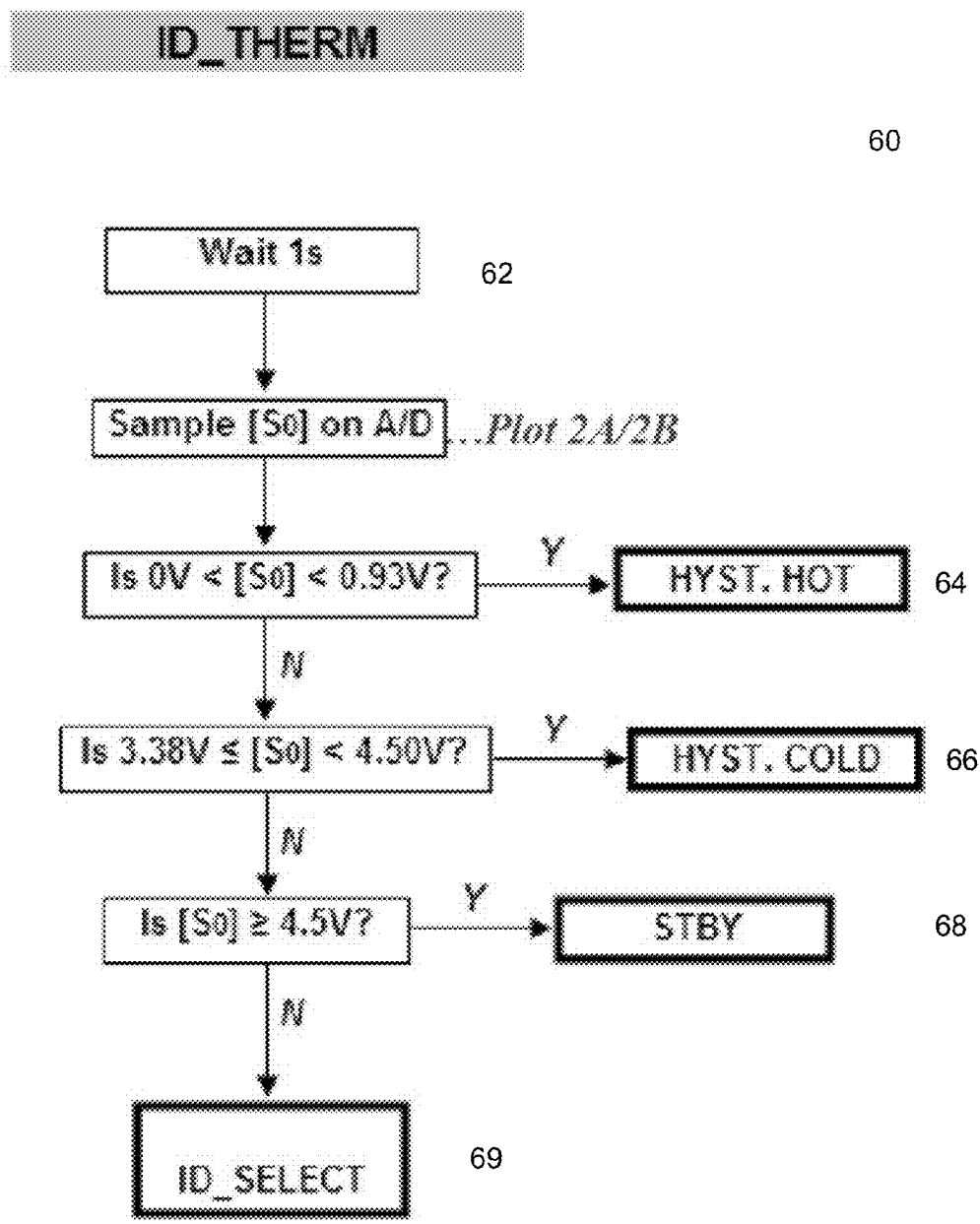
Figure 9:
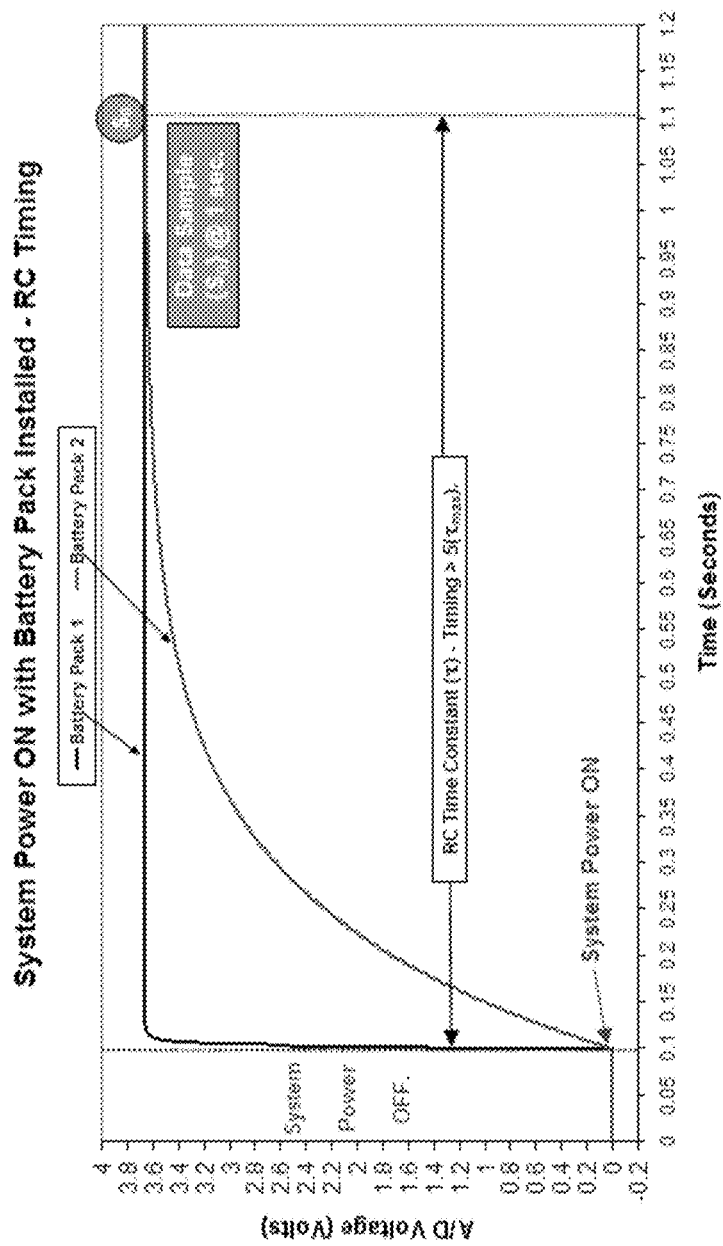
Figure 10:
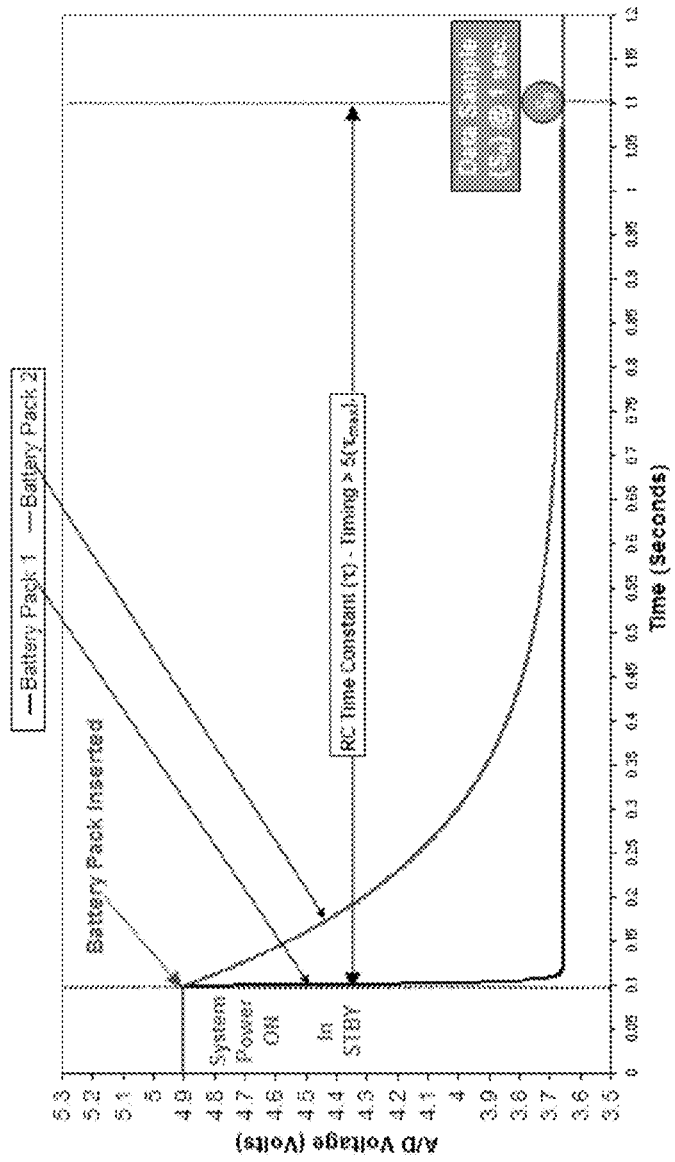

Referring now to FIG. 5, the ID_THERM routine 60 is shown. After a battery pack installation is detected and the voltage on the thermistor pin of the battery pack stabilizes (after approximately 1 second) 62, (as illustrated in FIG. 9 or 10 (Plot 2A and Plot 2B)), battery pack temperature is verified, by $S_0$ being outside a hot 64 or cold 66 range and if the value of $S_0$ is above 4.5 V (indicating that the battery is not present), the charger returns to standby 68 otherwise the charger invokes the ID Select procedure 70 to determine the time constant (τ) provided by the battery pack and charger circuitry combination.

Figure 6:
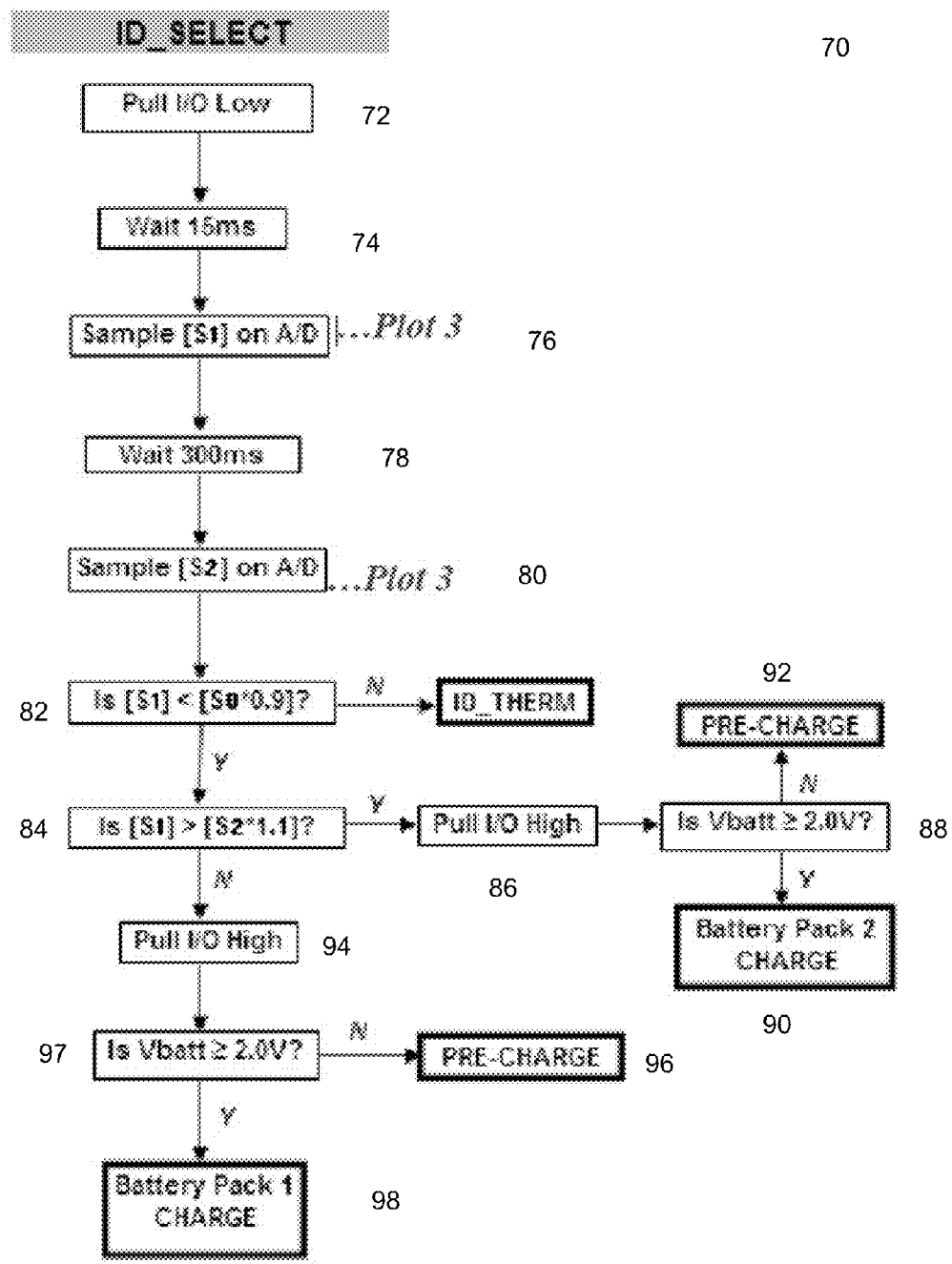
Figure 11:
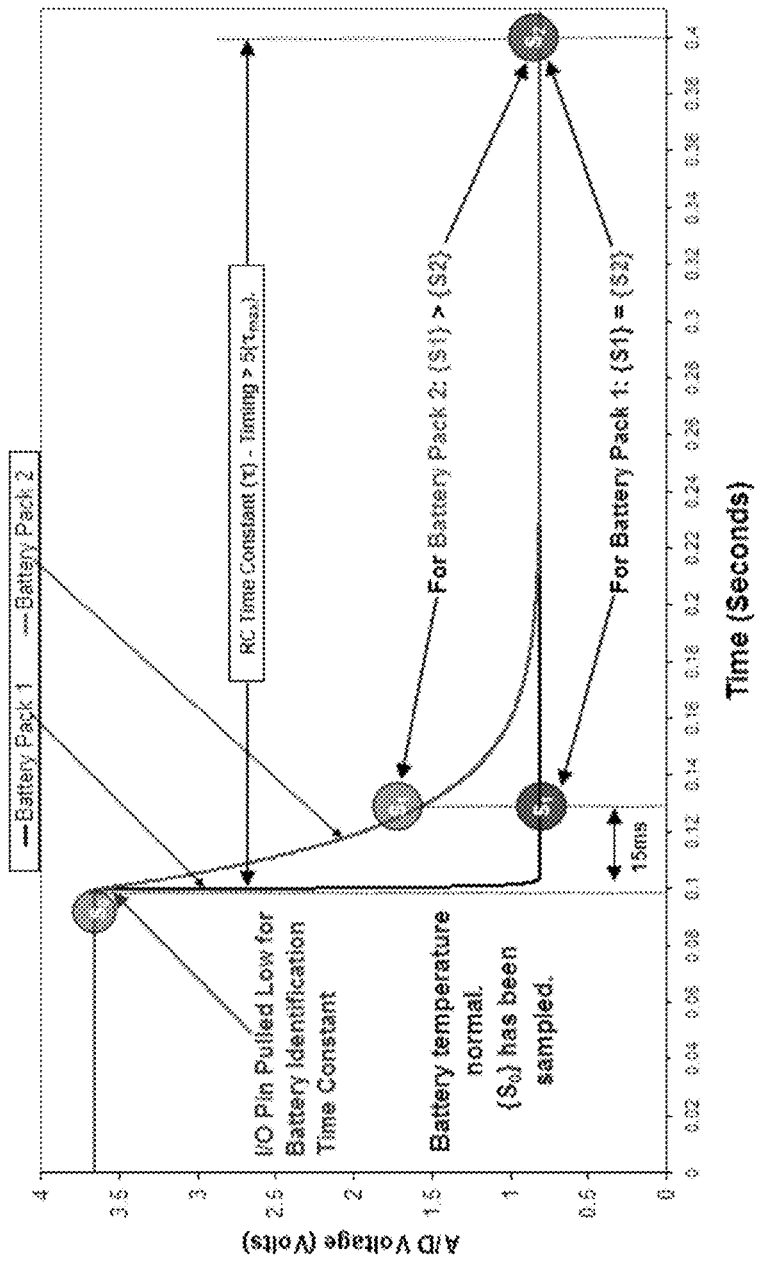

Referring now to FIG. 6, a time constant for the battery pack is measured 70 by applying a waveform to the thermistor (Battery Pack 1) or through the thermistor/capacitor combination (Battery Pack 2) by causing 72 I/O pin on the MCU to go to a low level. When the I/O pin is connected to the thermistor with via the resistor, $R_{pd}$, and forced to low level, the capacitors $C_{bp2}$ and/or $C_{a/d}$ begin to discharge. The process waits 74 (e.g., for 15 ms) and the signal at the thermistor is sampled {S1} 76 (plot 3, FIG. 11) and later, after waiting 78 for the voltage to stabilize (after 300 ms,) is again sampled 80 ({S2}).

Placing a capacitor, $C_{bp2}$, which is much larger than the host A/D pin filter capacitor, $C_{a/d}$, in parallel with the battery pack thermistor, (Battery Pack 2) provides a much larger time constant ($\tau_{BP2}$) than the time constant ($\tau_{BP1}$) associated with a pack with solely a thermistor (Battery Pack 1). In the case of Battery Pack 2 being present, {S1} is significantly greater than {S2}. In the case of Battery Pack 1 being present, {S1} is close to but not equal to {S2}.

Conditional operations performed by the MCU on the sampled signals subsequently identify the type of battery pack. Conditional operations include comparing $S_1$ to $S_0$ to determine if the MCU routine should invoke 82 the ID_THERM process ($S_1 < S_0 * 0.9$) or if the sample $S_1$ is greater than ($S_2 * 1.1$) 84, ($S_2$ being the quiescent value) forcing the I/O pin high 86, and if the battery voltage is greater than or equal to 2.0V, 88 identify 90 as battery pack 2 or if not returning 92 to a pre-charge routine. If the sample $S_1$ is not greater than ($S_2 * 1.1$) 84 the process 70 pulls the I/O pin high 94 and if the battery voltage is not greater than or equal to 2.0V, 97 invokes 96 the pre-charge routine or if the battery voltage is greater than 2.0V identify the battery pack 98 as battery pack 1.

Figure 7:
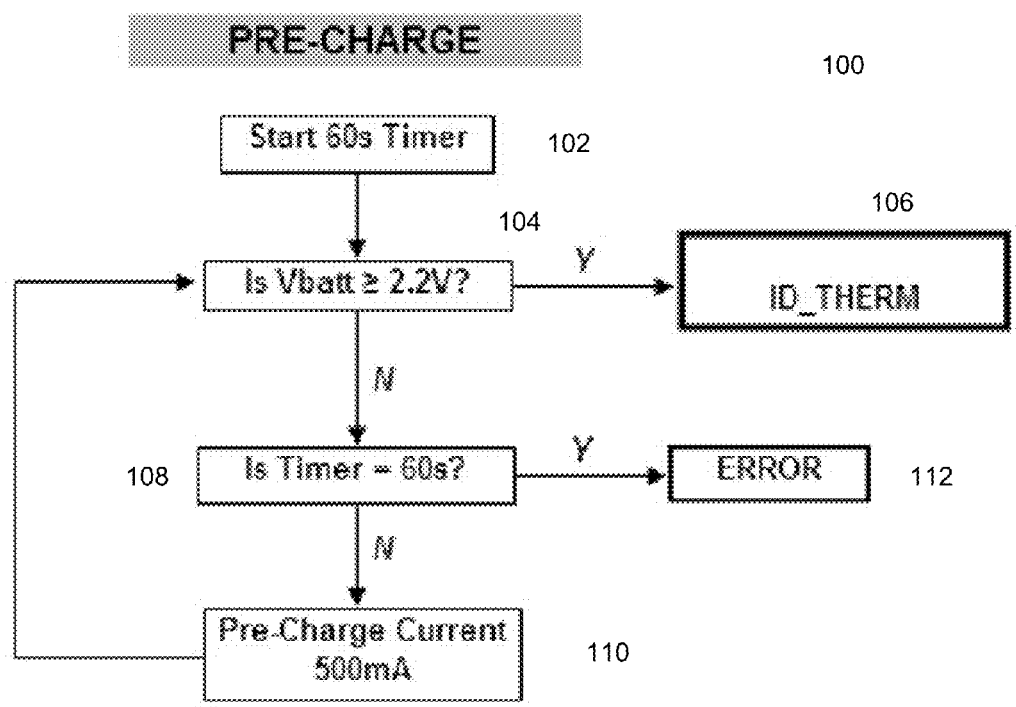

Referring now to FIG. 7, a pre-charge routine 100 starts a timer 102, determines 104 if the battery voltage is greater than 2.2 volts, and if so invokes 106 the $ID_{13}$ THERM routine. If the battery voltage is not greater than 2.2 volts and timer is at 60 seconds, the pre-charge routine invokes an error 112, otherwise the routing pre-charges 110 the battery with a specified current, e.g., 500 ma.

The voltage waveforms for the two different pack types are illustrated in Plot 3 (FIG. 10). After the determination of the battery pack type the I/O pin is pulled high, and the charger system determines battery voltage to either initialize pre-charge, or battery pack specific charge regime, and temperature is monitored throughout the charge cycle.

Exemplary charging regimes and details on chargers can be found in published applications US-2008-023836-A1 or US-2008-0238362-A1 each of which are incorporated herein by reference.

The timing required in taking data samples {S0}, {S1} and {S2} is selected to ensure sufficient resolution between data sample values to account for component and power supply tolerances, and variations in the RC time constants throughout the temperature range.

Curves for Plots 1, 2A, 2B, and 3 (FIGS. 8-11) are calculated for the following values:

$Vcc = 4.9V$ $R_{pu} = 155$ kOhms(+1%)

$R_{pd} = 33.2$ kOhms(+1%)

$C_{\_a/d} = 0.022$ uF(+15%)

$C_{\_bp2} = 1$ uF(+15%)

Using values with upper % tolerances, the plot curves and calculations are for maximum RC time constants.

During System Start-up with No Battery pack (FIG. 8):

$\tau_{SYS} = R_{pu} \times C_{\_a/d}$

During System Power ON with Battery pack installed (FIG. 9):
Battery Pack 1:

$\tau_{BP1} = R_{th} \| R_{pu} \times C_{\_a/d}$

Battery Pack 2:

$\tau_{BP2} = R_{th} \| R_{pu} \times (C_{\_a/d} + C_{\_bp2})$

During System Powered ON in STBY, and Battery pack Inserted (FIG. 10):
Battery Pack 1:

$\tau_{BP1} = R_{th} \| R_{pu} \times C_{\_a/dD}$

Battery Pack 2:

$\tau_{BP2} = R_{th} \| R_{pu} \times (C_{\_a/d} + C_{\_bp2})$

During ID Select with Battery pack Installed (FIG. 11):
Battery Pack 1:

$\tau_{BP1} = R_{th} \| R_{pd} \| R_{pu} \times (C_{\_a/d})$

Battery pack 2:

$\tau_{BP2} = R_{th} \| R_{pd} \| R_{pu} \times (C_{\_a/d} + C_{\_bp2})$

Based on various values of the transient response, different battery packs can be identified. From these battery packs different charge regimes can be used.

As an illustrative example, a look up table can be produced. Exemplary fields can include:

| Transient response value | Battery pack type | Battery chemistry | Battery configuration | Number of batteries |
|---|---|---|---|---|
| Value 1 | | | | |
| * * * | | | | |
| Value n | | | | |

An identification scheme is provided for battery pack types and by inference, battery chemistries with the foregoing. By assigning different values of transient response, e.g., fall time, to different battery pack types and knowing the configuration of the batteries in particular battery packs a look-up table can be populated and accessed to identify a battery pack type. Other arrangements are possible. With knowledge of the battery pack type an inference of battery chemistry and number of cells, and configuration can be made. Such information can be stored in a look-up table or the like accessible by a controller unit that is part of a battery charger unit. This information can be directly or indirectly used to select a particular charging regime for charging batteries in the identified battery pack.

Aspects of the invention can be implemented in digital electronic circuitry or in computer hardware, firmware, software, or combinations thereof. Apparatus of the invention can be implemented in a computer program product tangibly embodied in a machine-readable storage device for execution by a programmable processor such as the MCU; and method actions can be performed by a programmable processor such as the MCU executing a program of instructions to perform functions. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Storage devices suitable for tangibly embodying computer program instructions and data include all forms of non-volatile memory, including by way of example semiconductor memory devices, such as EPROM, EEPROM, and flash memory devices and the like. Any of the foregoing can be supplemented by, or incorporated in, ASICs (application-specific integrated circuits) implemented as state machine structures or the like.

Other Embodiments

A number of embodiments of the invention have been described. Nevertheless, it will be understood that various modifications may be made without departing from the spirit and scope of the invention. Accordingly, other embodiments are within the scope of the following claims.

Alternate embodiments are envisioned. For example, an alternate embodiment would have an inductor disposed in series with the thermistor. A battery pack with an inductor in series with the thermistor has one end of the series combination connected to the ID/Therm contact pad, and the other end connected to the common terminal. When the battery pack is inserted, and Vcc voltage is applied to the ID/Therm contact pad, current flows through the inductor and thermistor to generate a voltage potential in relation to the direction of current flow. When identifying battery pack chemistry (two battery packs, Battery Pack 1 consisting of a sole thermistor, and Battery Pack 2 including a thermistor in series with an inductor), the voltage potential through $V_{cc}$ is abruptly disconnected, by circuitry inside the charger. If Battery Pack 2 is present, current will drop rapidly as a function of time, thus it can be shown from the following equation:

$$v(t)=L \times ((di/dt) \times (t))$$

where: L=Inductor Value in Henrys
i=Current in Amps
v=Voltage in Volts

When voltage is disconnected abruptly in a short time, for Battery Pack 2, di/dt will correspond to a negative change in current over time (t), which will result in a negative voltage across the inductor for that time (t), as current flows in the opposite direction. If Battery Pack 1 is present, the voltage will only drop to zero.

Another alternative embodiment includes measuring the time constant quickly after battery pack insertion or start up, where ($C_{\_bp2} \gg C_{\_a/d}$) and also knowing that Battery Pack 1 has solely a thermistor, and Battery Pack 2 has a thermistor in parallel with $C_{\_bp2}$. The process for identifying a battery pack would occur quickly after startup with battery pack already installed or quickly after the battery pack insertion is detected, measuring the time constant upon first charging the RC rather than applying a signal to the RC network separately. In this approach the I/O pin and $R_{pd}$ are not required, reducing the cost, complexity and the time required to perform identification. Conversely, such a system would require a free interrupt in the MCU which can be dedicated solely to being triggered upon battery insertion.

The battery packs of FIGS. 2 and 3 have the same thermistor component $R_{th}$ on both battery packs. The host device contains an MCU with A/D functionality and provides a well regulated $V_{cc}$ power rail. The component C_BP2 in Battery Pack 2 is chosen to be substantially greater than $C_{\_A/D}$.

In other embodiments, different battery packs can have different thermistor values and thus different, albeit less dramatic variations in transient response are provided from the battery packs.

This arrangement provides a charger configured to determine, apply and control charging current for charging a rechargeable battery without the need for prior knowledge of the battery or battery pack type and/or capacity.

What is claimed is:

1. A method comprises:
identifying a type of battery pack and a temperature of the battery pack by:
receiving by a controller device, an interrupt signal triggered upon: (i) insertion of the battery pack into a charging device or (ii) controller device startup when the battery pack is already installed in a charging device;
measuring by a controller device, in response to the interrupt signal, a voltage on a sense terminal of the battery pack that has a thermistor coupled to the sense terminal;
determining by the controller device from the measured voltage, the temperature of the battery pack;
measuring by the controller device a transient response of the battery pack to receiving the interrupt signal; and
determining from the measured transient response the battery pack type.

2. The method of claim 1, further comprising:
determining a charging current to be applied to the battery based on the measured transient response; and
applying the determined charging current to the battery.

3. The method of claim 1, further comprising:
applying by the controller device a signal to the sense terminal of the battery pack;
measuring by the controller device a transient response of the battery pack to the applied signal applied to the sense terminal;
applying the signal by causing a first terminal of a controller unit of a battery charger to a low state with the first terminal of the controller unit being coupled to the sense terminal of the battery pack; and
measuring the transient response of the battery to the applied signal at a second, different terminal of the controller unit of the battery charger.

4. The method of claim 1, further comprising:
applying by the controller device a signal to the sense terminal of the battery pack;
measuring by the controller device a transient response of the battery pack to the applied signal applied to the sense terminal;
measuring the voltage between the sense terminal of the battery pack and an input to a controller in response to applying the signal at a first time instance; and
measuring the voltage between the sense terminal of the battery pack and the input of the controller in response to applying the signal at a subsequent time instance.

5. The method of claim 4, further comprising:
computing a value of the transient response over the first and subsequent instances of time.

6. The method of claim 1, wherein determining the battery pack comprises:
accessing by the controller device a lookup table storing transient response values, associated with plural, different types of battery packs to provide an indication of battery pack type.

7. The method of claim 1, wherein the battery is lithium-iron-phosphate electrochemical cell.

8. The method of claim 1, further comprising:
accessing by the controller device a lookup table storing transient response values, associated with plural, different types of battery packs to provide an identification of battery pack type;
accessing by the controller device a second lookup table storing multiple charging current values, associated with the identified battery type;
periodically measuring the voltage between terminals of the battery; and
adjusting the charging current applied to the battery when the measured voltage between the terminals of the battery reaches a pre-determined voltage value such that the voltage between the terminals of the battery is maintained at the pre-determined voltage value.

9. The method of claim 1 wherein the battery pack comprises a resistor and the transient response of the battery pack is measured taking into consideration the value of resistance of the resistor.

10. The method of claim 9 wherein the resistor is a thermistor and the method further comprises:
measuring by the controller the value of resistance of the thermistor to infer a value of temperature of the battery in the battery pack;

determining by the controller, the transient response of the battery pack is measured taking into consideration the value of resistance of the thermistor.

11. The method of claim 10, wherein the battery pack further includes a capacitor and an inductor and the method further comprises:
determining by the controller, the transient response of the battery pack taking into consideration resistance of the thermistor, inductance of the inductor, and capacitance of the capacitor,
measuring the value of resistance of the thermistor to infer a value of temperature of the battery in the battery pack.

12. A charging device comprises:
a charging compartment configured to receive a rechargeable battery housed in a battery pack, the charging compartment having electrical contacts configured to be coupled to respective sense, reference and output terminals of the battery pack; and
a controller configured to:
receive an interrupt signal triggered upon: (i) insertion of the battery pack or (ii) controller device startup with the battery pack already installed;
measure a resistance value at the sense terminal;
determine from the measured resistance the temperature of the battery pack;
measure, in response to the interrupt signal, a transient response of the battery pack; and
determine the battery pack type from the measured transient response.

13. The device of claim 12 wherein the controller is further configured to: cause the determined charging current to be applied to the battery.

14. The device of claim 12 further comprising:
the controller further configured to:
apply a signal to the sense terminal of the battery pack; and
measure a transient response of the battery pack to the applied signal that is applied to the sense terminal;
a capacitor coupled to a first input of the controller; and
a resistor coupled to an output terminal of the controller, the output terminal supplying the signal to the battery pack.

15. The device of claim 14 wherein the controller is configured to determine the transient response of the battery pack to the signal by:

$$\tau_{BP1}=R_{th}\|R_{pd}\|R_{pu}\times(C_{\_a/d})$$

where $R_{th}$ is a resistor in the battery pack, $R_{pd}$ and $R_{pu}$ are resistors coupled to the output terminal and a voltage supply of the controller respectively, and $C_{\_a/d}$ is the capacitor coupled to the first input of the controller.

16. The device of claim 14 wherein the controller is configured to determine the transient response of the battery pack to the signal by:

$$\tau_{BP1}=R_{th}\|R_{pd}\|R_{pu}\times(C_{\_a/d}+C_{\_bp2})$$

where $R_{th}$ is a resistor in the battery pack, $R_{pd}$ and $R_{pu}$ are resistors coupled to the output terminal and a voltage supply of the controller respectively, $C_{\_a/d}$ is a capacitor coupled to the first input of the controller, and $C_{\_bp2}$ is a capacitor coupled to a terminal of the battery pack in parallel with the resistor $R_{th}$.

17. The device of claim 12 further comprising the battery pack, with the rechargeable battery and with the battery pack further comprising:
a lithium-iron-phosphate rechargeable battery as the rechargeable battery;
the housing having the reference, output and sense terminals;
a resistor disposed in the housing, the resistor having one end coupled to the reference terminal and second end coupled to the sense terminal; and
a capacitor coupled to the sense and reference terminals in parallel with the resistor.

18. A battery pack for housing a rechargeable battery, comprising:
a housing having a reference, an output terminal, and a sense terminal;
a rechargeable battery disposed in the housing, the rechargeable battery having a reference terminal coupled to the reference terminal of the housing and an output terminal coupled to the output terminal of the housing;
a resistor disposed in the housing of the battery pack, the resistor having one end coupled to the reference terminal of the battery pack and second end coupled to the sense terminal of the battery pack;
a capacitor coupled to the sense terminal of the battery pack and the reference terminal of the battery pack, and coupled in parallel with the resistor; and
an inductor coupled in series with the resistor between the reference terminal of the battery pack and the sense terminal of the battery pack.

19. The battery pack of claim 18 wherein the output terminal of the battery pack is further comprising: a positive output terminal of the battery pack that is configured to coupled to the output terminal of the rechargeable battery that is an anode of the rechargeable battery.

20. The battery pack of claim 19 wherein the reference terminal of the battery pack is coupled to a cathode of the rechargeable battery further comprising: a rechargeable cell disposed in the battery pack having an anode terminal coupled to the positive output terminal of the battery pack and a cathode coupled to the reference terminal of the battery.

21. The battery pack of claim 18 wherein the battery output terminal of the battery pack and the sense terminal of the battery pack are different terminals, with the battery output terminal electrically isolated from the sense terminal.

22. The battery pack of claim 18 wherein the resistor is a thermistor that has a resistance characteristic that changes with temperature.

23. The battery pack of claim 18 wherein the battery pack is identified using at least one of: (i) the resistance of the thermistor, (ii) the inductance of the inductor, and (iii) the capacitance of the capacitor, and the battery pack temperature is determined using the resistance of the thermistor.

24. The battery pack of claim 18 wherein the rechargeable battery includes a lithium-iron-phosphate rechargeable battery.

25. The battery pack of claim 18 wherein the rechargeable battery is one or more lithium-iron-phosphate rechargeable batteries and the resistor is a thermistor and the capacitor has a capacitance value of about 1 uf.

26. The battery pack of claim 18 that is configured to be charged by a charger, and wherein the capacitor has a substantially high capacitance value in comparison to a capacitance value of an input terminal to the charger that receives a transient signal from the sense terminal.

27. The method of claim 10, wherein the battery pack further includes a capacitor and an inductor and the method further comprises:

determining by the controller, the transient response of the battery pack taking into consideration resistance of the thermistor, inductance of the inductor, and capacitance of the capacitor, measuring the value of resistance of the thermistor to infer a value of temperature of the battery in the battery pack.

28. The device of claim 12 further comprising the battery pack, with the rechargeable battery and with the battery pack further comprising:

a lithium-iron-phosphate rechargeable battery as the rechargeable battery;

the housing having the reference, output and sense terminals;

a resistor disposed in the housing, the resistor having one end coupled to the reference terminal and second end coupled to the sense terminal; and a capacitor coupled to the sense and reference terminals in parallel with the resistor;

an inductor coupled in series with the resistor between the reference terminal and the sense terminal;

wherein the controller is configured to determine the transient response of the battery pack to an abrupt interruption to the voltage of the signal by measuring a voltage across the inductor.

* * * * *